United States Patent [19]

Tomizuka et al.

[11] Patent Number: 5,155,570

[45] Date of Patent: Oct. 13, 1992

[54] SEMICONDUCTOR INTEGRATED CIRCUIT HAVING A PATTERN LAYOUT APPLICABLE TO VARIOUS CUSTOM ICS

[75] Inventors: Kazuo Tomizuka; Sakae Sugayama; Takao Saeki; Toshiaki Imai, all of Gunma, Japan

[73] Assignee: Sanyo Electric Co., Ltd., Osaka, Japan

[21] Appl. No.: 675,031

[22] Filed: Jan. 25, 1991

Related U.S. Application Data

[63] Continuation of Ser. No. 369,184, Jun. 20, 1989, abandoned.

[30] Foreign Application Priority Data

| Jun. 21, 1988 | [JP] | Japan | 63-153122 |
| Jul. 12, 1988 | [JP] | Japan | 63-173003 |
| Jul. 12, 1988 | [JP] | Japan | 63-173004 |
| Jul. 12, 1988 | [JP] | Japan | 63-173005 |
| Jul. 12, 1988 | [JP] | Japan | 63-173009 |
| Jul. 12, 1988 | [JP] | Japan | 63-173010 |
| Aug. 12, 1988 | [JP] | Japan | 63-202196 |
| Sep. 20, 1988 | [JP] | Japan | 63-235828 |

[51] Int. Cl.⁵ .............................. H01L 27/02
[52] U.S. Cl. ............................ 357/40; 357/41; 357/45; 357/47
[58] Field of Search ............. 357/40, 41, 45, 47, 357/75, 80; 307/296.1, 441; 364/491; 361/380, 392, 397, 416, 409; 455/347, 348, 349

[56] References Cited

U.S. PATENT DOCUMENTS

| 3,303,400 | 2/1967 | Allison | 357/45 |
| 3,723,882 | 3/1973 | Carlson | 455/301 |
| 3,754,170 | 8/1973 | Tsuda et al. | 455/301 |
| 3,886,407 | 5/1975 | Watanabe et al. | 455/333 |
| 3,886,458 | 5/1975 | Matsumoto et al. | 455/333 |
| 4,006,492 | 2/1977 | Eichelberger et al. | 357/45 |
| 4,032,962 | 6/1977 | Balyoz et al. | 357/68 |
| 4,041,399 | 8/1977 | Tsuda | 455/301 |
| 4,135,158 | 1/1979 | Parmet | 325/317 |
| 4,383,173 | 5/1983 | Lunn | 455/337 |
| 4,388,632 | 6/1983 | Richardson | 357/15 |
| 4,589,003 | 5/1986 | Yamada et al. | 357/22 |
| 4,628,343 | 12/1986 | Komatsu | 357/48 |
| 4,661,998 | 4/1987 | Yamashite et al. | 455/301 |
| 4,684,973 | 8/1987 | Takano et al. | 357/75 |
| 4,689,825 | 8/1987 | Geiger et al. | 455/347 |
| 4,691,376 | 9/1987 | Watanabe et al. | 455/301 |
| 4,691,378 | 9/1981 | Kumanoto et al. | 455/301 |
| 4,855,613 | 8/1989 | Yamada et al. | 307/202.1 |
| 4,866,508 | 9/1989 | Eichelberger et al. | 357/74 |
| 5,050,238 | 9/1991 | Tomizuka et al. | 357/84 |

FOREIGN PATENT DOCUMENTS

| 3231952 | 3/1984 | Fed. Rep. of Germany | 455/349 |
| 0084542 | 5/1984 | Japan | 357/40 |
| 60-1843 | 1/1985 | Japan | 357/48 |
| 60-35537 | 2/1985 | Japan | 357/47 |
| 0035537 | 2/1985 | Japan | 357/40 |
| 60-165752 | 8/1985 | Japan | 357/40 |
| 60-154644 | 12/1985 | Japan | 357/40 |
| 62-12147 | 1/1987 | Japan | 357/47 |
| 0012147 | 1/1987 | Japan | . |
| 57195480 | 5/1989 | Japan | 357/48 |

OTHER PUBLICATIONS

English Translation of Japanese Patent Application Laying-Open No. 62-12147 of lines 13-18 of upper right column of p. 2 and line 18 of upper right column of p. 2 to line 3 of lower left column of p. 2, 1 page.

*Primary Examiner*—Rolf Hille
*Assistant Examiner*—Steven Loke
*Attorney, Agent, or Firm*—Darby & Darby

[57] ABSTRACT

A semiconductor integrated circuit is formed on a semiconductor chip (1) and it includes: a plurality of mat regions (A to T) each including a plurality of circuit elements (10 to 13); partition regions (4) for spacing the mat regions (A to T) from each other; and a pair of power supply line (2) and ground line (3) disposed on each of the partition regions (4). An electronic circuit formed on the semiconductor chip (1) includes circuit blocks having different functions but it is designed for a unit of each mat (A to T) not for a unit of each circuit block.

32 Claims, 14 Drawing Sheets

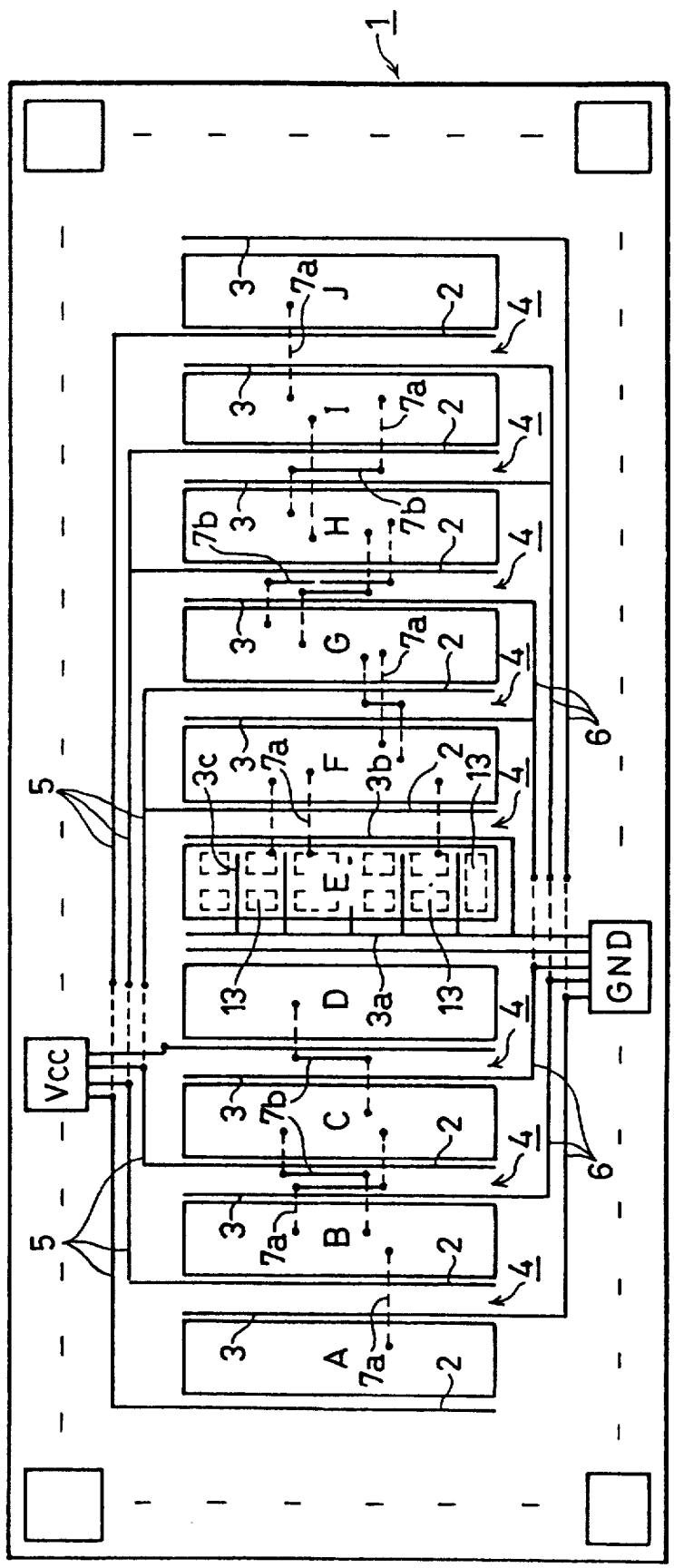

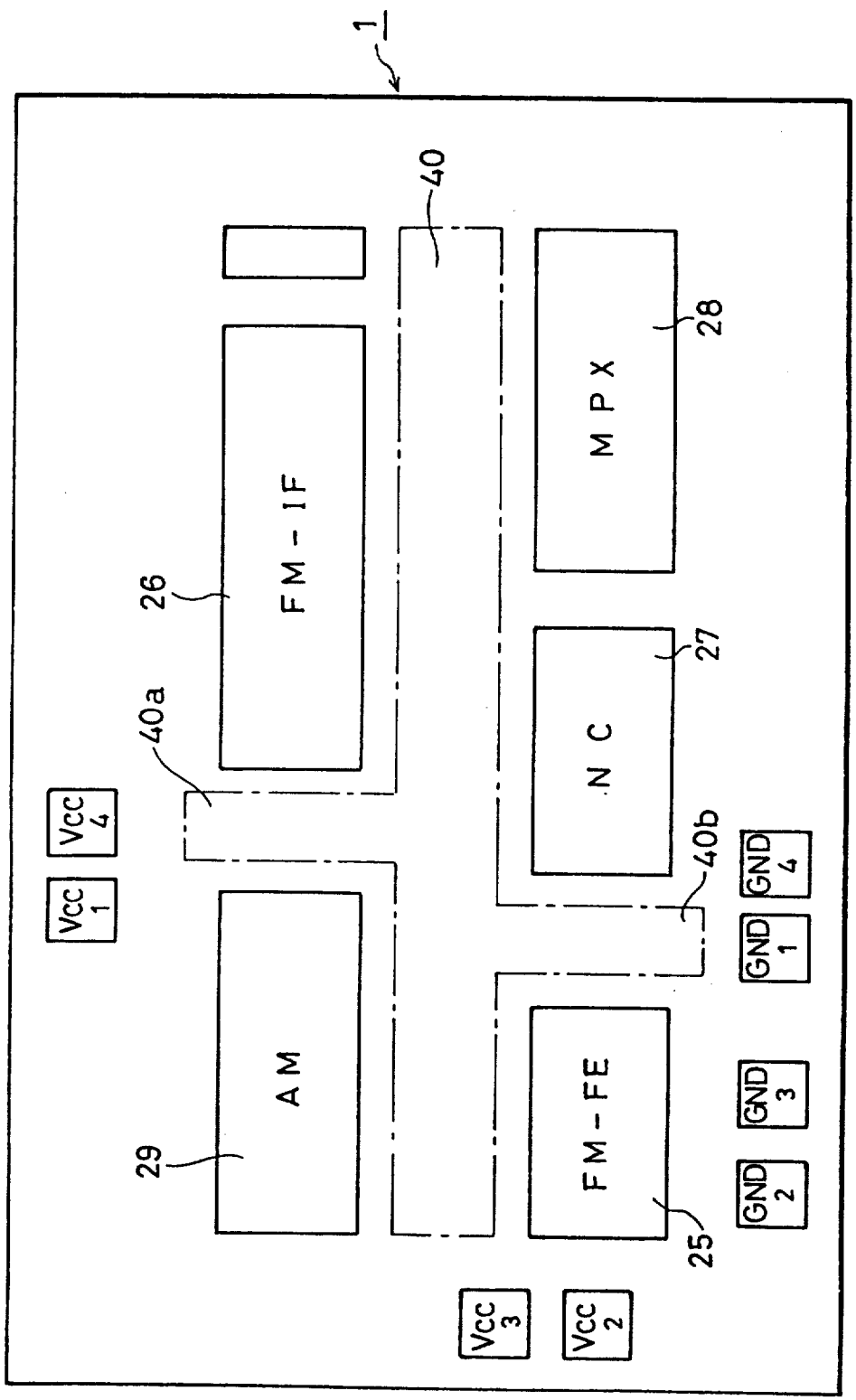

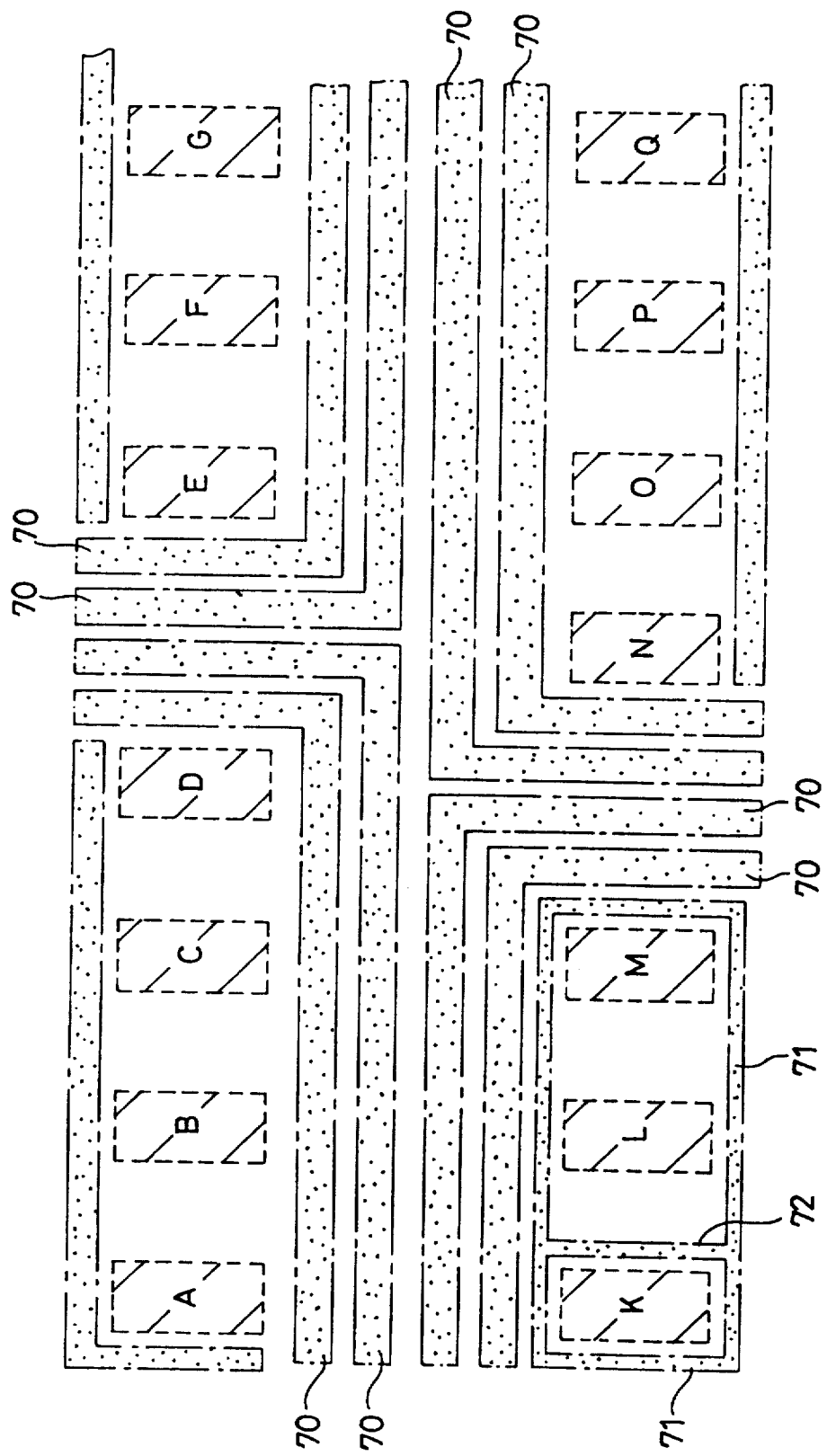

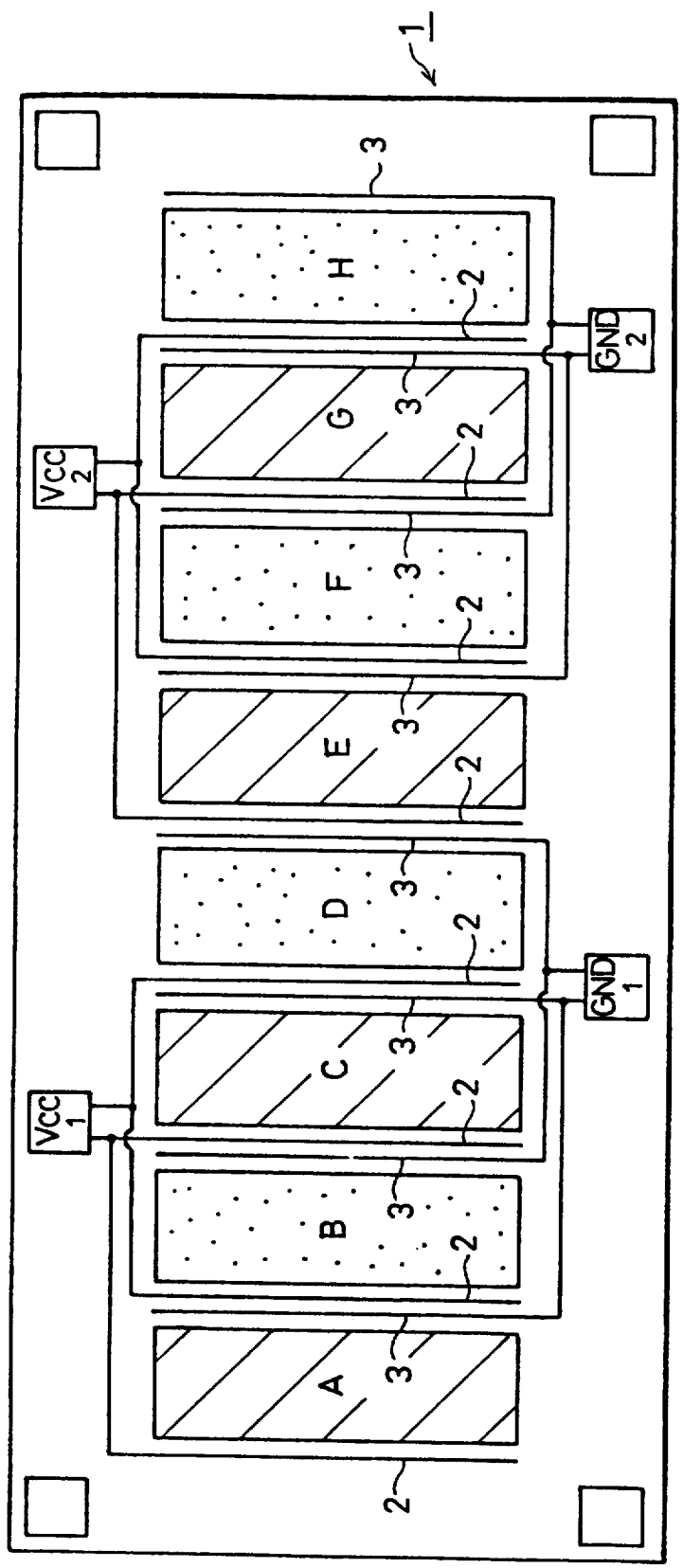

5,155,570

SEMICONDUCTOR INTEGRATED CIRCUIT HAVING A PATTERN LAYOUT APPLICABLE TO VARIOUS CUSTOM ICS

This is a continuation of application Ser. No. 369,184, filed Jun. 20, 1989, abandoned.

BACKGROUND OF THE INVENTION

1. Field of the Invention

The present invention relates to semiconductor integrated circuits (ICs) and particularly to a semiconductor IC having a pattern layout applicable to various custom ICs.

2. Description of the Background Art

FIG. 1A is a schematic top view showing an example of a pattern layout of a conventional semiconductor IC and FIG. 1B is a schematic sectional view taken along the line 1B—1B in FIG. 1A. Referring to those figures, a semiconductor chip 101 comprises circuit blocks 1a to 1f. Each of those circuit blocks is formed in an epitaxial N layer 103 on a P$^-$ semiconductor substrate 102 and surrounded by P$^+$ separation regions 104. The epitaxial layer 103 is covered with an oxide film 105. Ground lines 106 penetrate the oxide film 105 and they are in ohmic contact with the P$^+$ separation regions 104, whereby potentials of the P$^+$ separation regions 104 and P$^-$ substrate 102 are stably set to a ground potential.

A bundle of ground lines 106 extend from a ground bonding pad GND provided on the left of the semiconductor chip 101 through a central region of the semiconductor chip 101 and the ground lines 106 are distributed from the bundle to the corresponding circuit blocks 1a to 1f. Power supply lines extend from a power supply bonding pad Vcc provided on the right of the semiconductor chip 101 to peripheral regions of the semiconductor chip 101 so that they are connected to the corresponding circuit blocks.

In general, signals processed in the circuit blocks 1a to 1f have different frequencies and amplitude levels and those circuit blocks 1a to 1f have different functions. Thus, the circuit blocks 1a to 1f have different numbers of circuit elements and they have different areas. Accordingly, it is not easy to arrange efficiently the circuit blocks 1a to 1f having different areas in a small area. In addition, if the circuit block 1a for example is replaced by a modified circuit block (having a different area from the circuit block 1a) or a new circuit block is added, it is often necessary to rearrange all the circuit blocks 1a to 1f in order to set such a modified or new circuit block efficiently in a reduced area.

Further, in the case of arranging the circuit blocks, it is desirable to reduce the total area occupied by those circuit blocks and at the same time it is necessary to take measures to minimize undesirable mutual interferences of the circuit blocks. Consequently, for example in the case of changing part of a certain IC device in compliance with a request of a user, it is often necessary to entirely change the design of the circuit block pattern, which takes time and involves considerable cost.

SUMMARY OF THE INVENTION

In view of the above described prior art, an object of the present invention is to provide a semiconductor IC having a pattern layout applicable to various custom ICs.

Another object of the present invention is to provide a semiconductor IC in which mutual interferences of circuit blocks are minimized.

A semiconductor IC according to the present invention includes: a semiconductor chip; a plurality of mat regions including a plurality of circuit elements, formed of the semiconductor chip and surrounded by separation regions; partition regions for separating the plurality of mat regions from each other; and a pair of power supply line and ground line provided on each of the partition regions. An electronic circuit formed on the semiconductor chip includes circuit blocks having different functions and the electronic circuit is designed by using a mat as a unit, not a circuit block as a unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a top view showing schematically a pattern layout of a semiconductor IC according to an embodiment of the present invention.

FIG. 8 is a top view showing a positional relation of circuit blocks of an AM/FM tuner formed on a semiconductor chip.

FIG. 9 is a top view showing an arrangement of a plurality of elongate dummy islands.

FIG. 11A is a schematic top view of a semiconductor IC according to a further embodiment of the present invention.

DESCRIPTION OF THE PREFERRED EMBODIMENTS

Figure 1A:
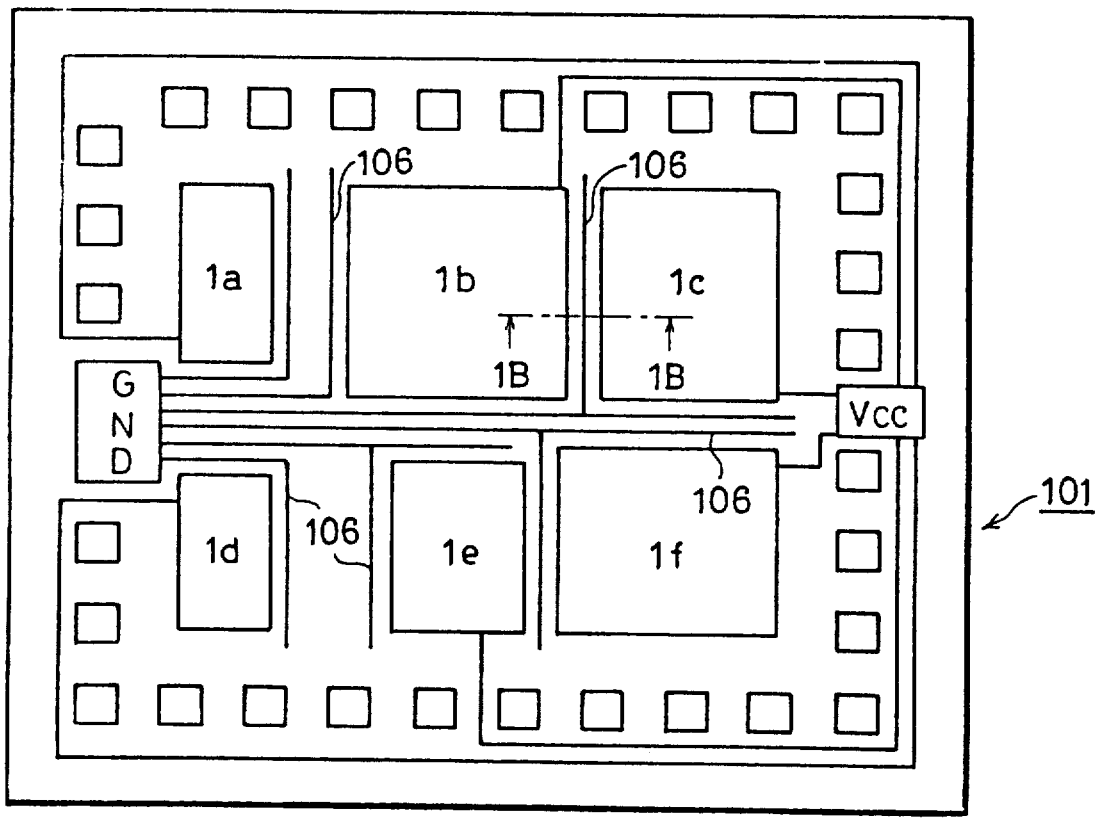
FIG. 1A is a schematic top view showing an example of a pattern layout of a conventional semiconductor IC.
Figure 1B:
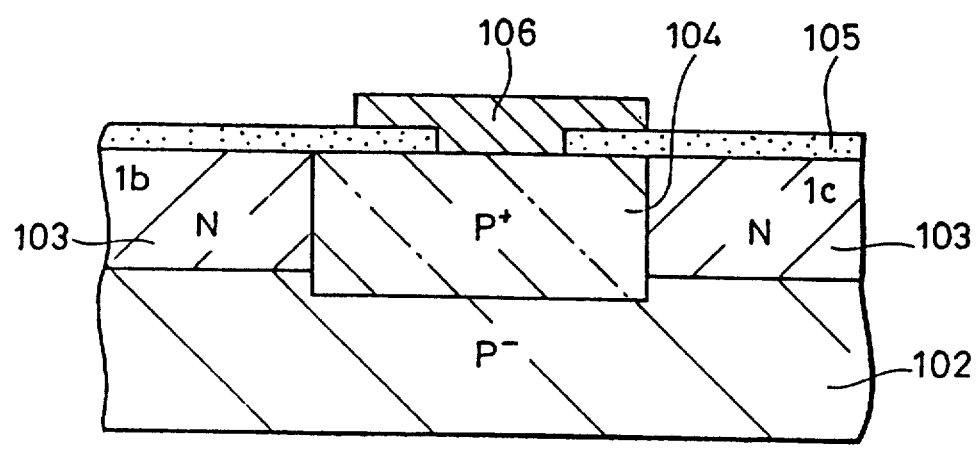
FIG. 1B is a schematic sectional view taken along the line 1B—1B in FIG. 1A.

Referring to FIG. 2, a surface pattern of a semiconductor IC according to an embodiment of the present invention is schematically shown. Mats A to J separated from each other by partition belts 4 are provided on a semiconductor chip 1 and a plurality of circuit elements are formed in each of those mats A to J. Power supply lines 2 and ground lines 3 parallel to each other are normally provided on the respective partition belts 4. A power supply line 2 is provided adjacent to the left side of each of the mats A to J and a ground line 3 is provided adjacent to the right side thereof. Accordingly, only one power supply line exists on the left side of the mat A at the left end and only one ground line 3 exists on the right side of the mat J at the right end.

A bundle 5 of power supply lines extends from a power supply pad Vcc along an upper side of the semiconductor chip 1 in the figure and each of the power supply lines 2 on the partition belts 4 is connected to the corresponding power supply line of the bundle 5. Similarly, a bundle 6 of ground lines extends from a ground pad GND along a lower side of the semiconductor chip 1 and each of the ground lines 3 on the partition belts 4 is connected to the corresponding one of the ground lines of the bundle 6. In other words, the power supply lines and the ground lines have comblike forms and those two comb-like forms are opposed to each other with the teeth of one of them being inserted between the respective adjacent teeth of the other. Accordingly, pluralities of mats, power supply lines, ground lines and the like can be arranged efficiently in a compact manner in a small area.

Those power supply lines 2 and 5 and ground lines 3 and 6 are formed substantially in a first layer of two conductor layers. However, as shown by the broken lines near the power supply pad Vcc and the ground pad GND, the power supply lines 5 and ground lines 6 are partially continuous with each other through a second layer in order to accomplish 2-level crossing. The small black dots at the respective ends of the broken lines represent connections of the conductors of the first and second layers.

The mats A to J have substantially the same rectangular form and size. For example, a shorter side of each mat is set to a dimension making it possible to arrange six bipolar transistors. A longer side of each mat is set to a dimension making it possible for the mat to contain about 100 circuit elements, easy to handle in design. However, the mat size can be set to an arbitrary size which can contain a preferable number of circuit elements according to circuit blocks incorporated in an IC device.

Circuit elements such as transistors, diodes, resistors and capacitors can be integrated in each mat and those circuit elements are separated from each other by normal PN junction. The circuit elements are interconnected substantially by the conductors in the first layer and partially by the conductors in the second layer to accomplish the 2-level crossing.

The circuit elements in the different mats are interconnected substantially through the conductors in the second layer as shown by the broken lines 7a in FIG. 2 and those conductors 7a cross over the power supply lines 2 and the ground lines 3. The conductors 7a in the second layer can be also connected by means of conductor segments 7b in the first layer represented as short solid lines between the power supply lines 2 and ground lines 3 parallel with each other in order to attain the 2-level crossing between the conductors 7a, while avoiding mutual interference with the circuit elements in the mats.

Figure 3A:
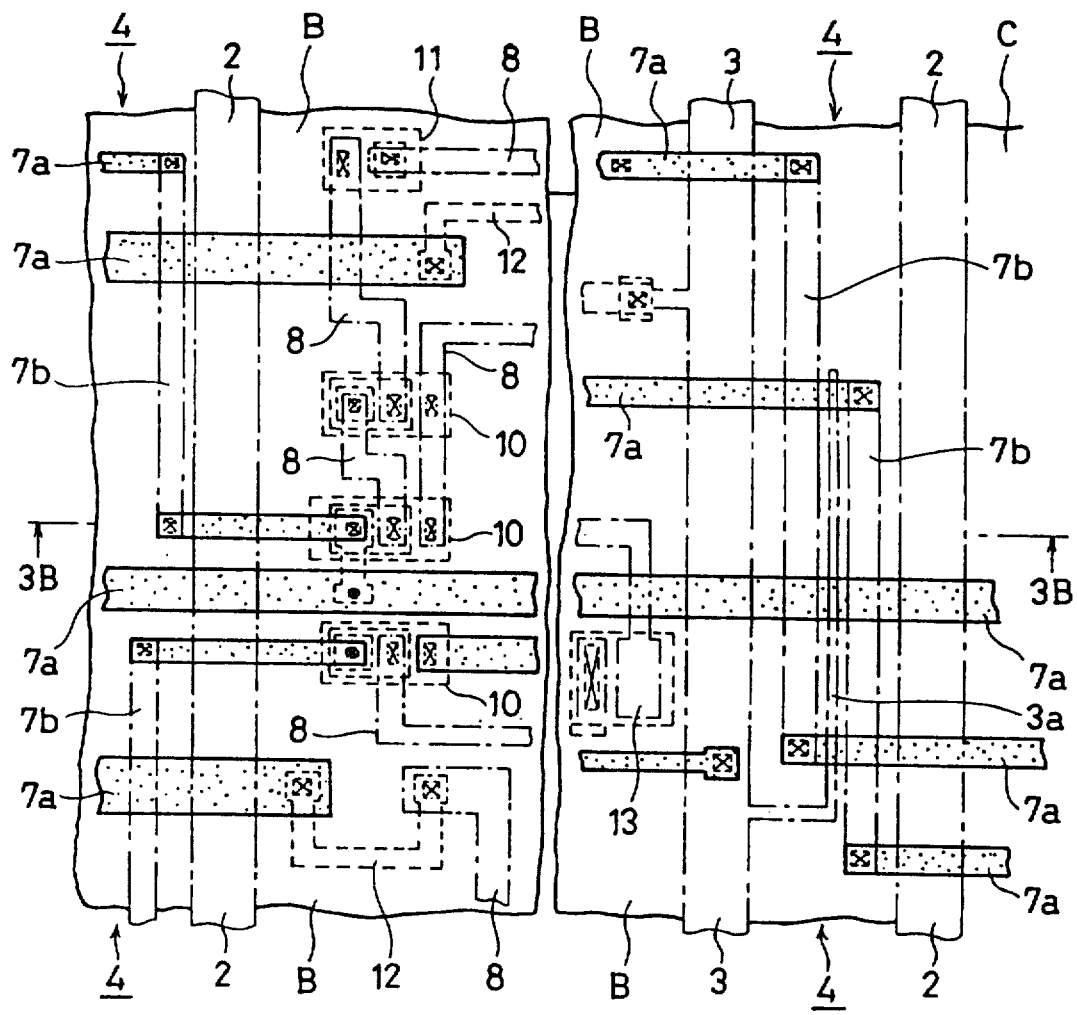
FIG. 3A is a an enlarged detailed view of a part of FIG. 2.

Referring to FIG. 3A, a top view of a region near the mat B is partially shown in an enlarged manner. The conductors 2, 3, 3a, 7b, 8 represented by the chain lines exist in the first layer and the conductors 7a smudged and surrounded by the solid lines exist in the second layer. The conductors 2, 3, 3a, 7b, 8 in the first layer and the conductors 7a in the second layer can be connected through contact regions represented by the marks x. The mat B exists between the power supply line 2 on the left side and the ground line 3 on the right side and the circuit elements such as transistors 10, diodes 11, resistors 12 and capacitors 13 represented by the broken lines are formed in the mat B. Although those circuit elements 10 to 13 are roughly shown for the purpose of clarifying the drawing, they are in reality integrated with high density.

As described above, the conductors 7a in the second layer are used for the interconnections of the mats, e.g., signal lines or feedback lines. The conductors 7a in the second layer are arranged in parallel with each other in order to avoid mutual crossing on the plane. In order to make possible the 2-level crossing of those conductors 7a, the conductor segments 7b between the power supply lines 2 and the ground lines 3 in the partition belts 4 can be utilized. If it is necessary to prevent mutual interference between the respective adjacent two conductor segments 7b, conductors 3a derived from the ground line 3 (or the power supply line 2) are provided between the respective two adjacent conductor segments 7b so that the mutual interference can be reduced. Further, the power supply line 2 and the ground line 3 serve to reduce mutual interference between the conductor segments 7b and the mat adjacent thereto.

Figure 3B:
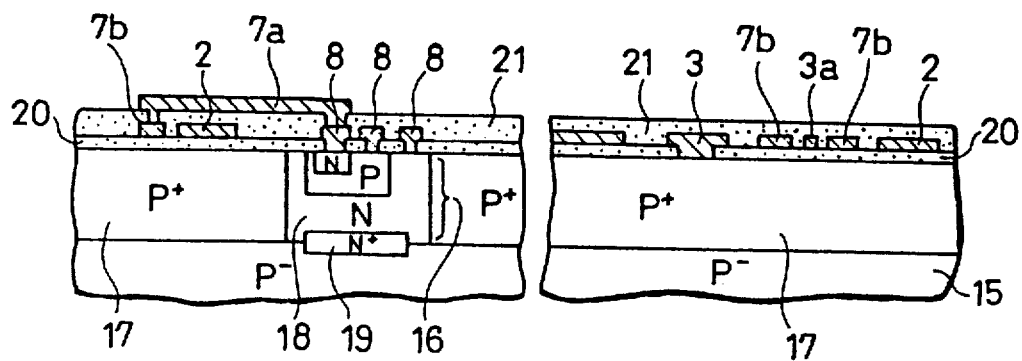
FIG. 3B is sectional view taken along the line 3B—3B in FIG. 3A.

Referring to FIG. 3B, a sectional view taken along the line 3B—3B in FIG. 3A is schematically shown. An N epitaxial layer 16 is formed on a P$^-$ semiconductor substrate 15. A large number of islands 18 surrounded by P$^+$ separation regions 17 are formed in the epitaxial layer 16. Each of the circuit elements such as the NPN transistors 10, the diodes 11, the resistors 12 and the capacitors 13 is formed in each one of those islands 18. A buried N$^+$ region 19 is formed between a collector N region 18 of each NPN transistor 10 and the P$^-$ substrate. The epitaxial layer 16 is covered with a silicon oxide film 20 formed by chemical vapor deposition (CVD) for example. Conductors 2, 3, 3a, 7b, 8 in the first layer are formed on the silicon oxide film 20 and those conductors are covered with an insulating film 21 of polyimide resin or the like. Conductors 7a in the second layer are formed on the insulating film 21.

The power supply lines 2 and the ground lines 3 are provided above the P$^+$ separation regions 17. The ground lines 3 penetrate the silicon oxide film 20 along the longitudinal direction thereof and they are in ohmic contact with the P$^+$ separation regions 17, so that the substrate 15 is stably set at a ground potential.

In the following, an example of a relation between the electronic circuit blocks and the mats A to J incorporated in the semiconductor chip in FIG. 2 will be described.

Figure 4:
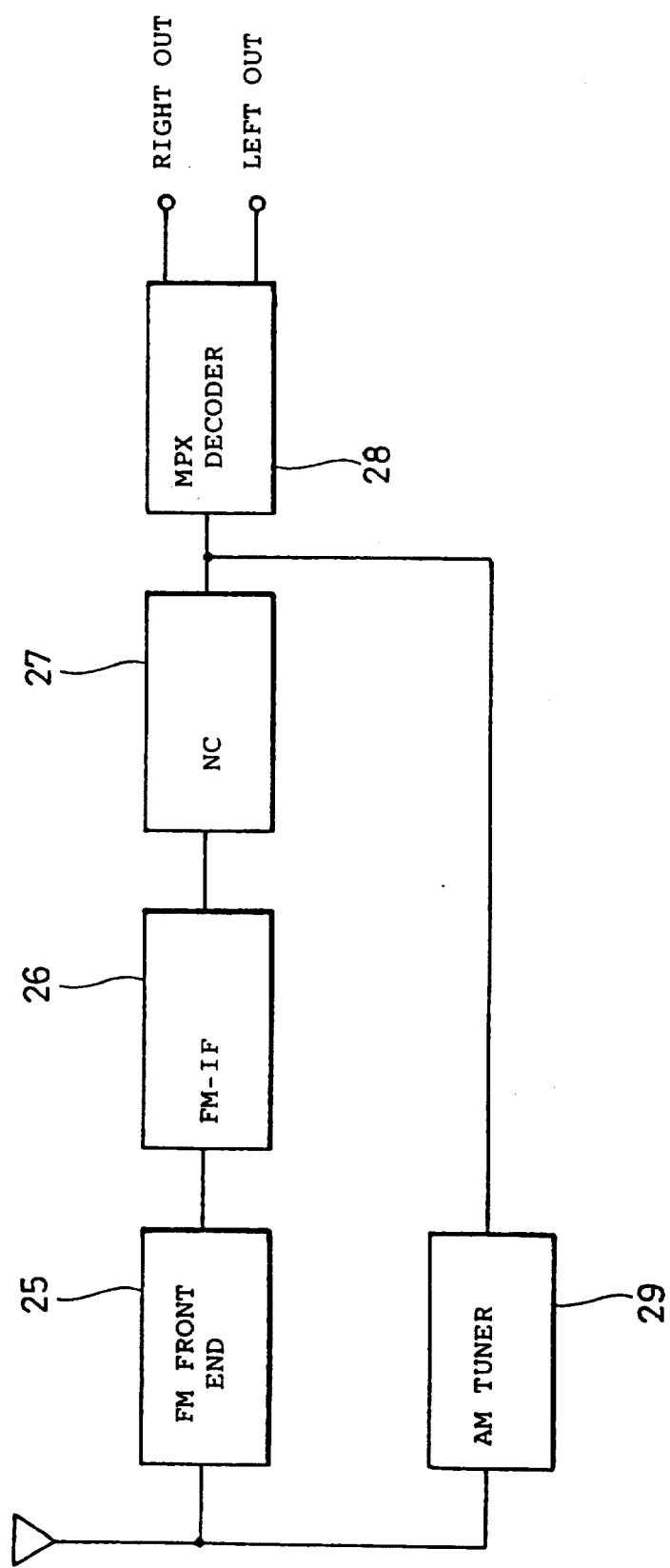
FIG. 4 is a circuit block diagram showing an example of an AM/FM stereo tuner.

FIG. 4 is a circuit block diagram showing an example of an AM/FM stereo tuner. An FM front end block 25 includes about 250 circuit elements and it receives an FM broadcasting signal of several tens of MHz to several hundreds of MHz and convert it to an intermediate frequency signal of 10.7 MHz. An FM-IF block 26 includes about 430 circuit elements and it amplifies the intermediate frequency signal and detects the amplified signal so that an audio signal is obtained. A noise canceller block 27 includes about 270 circuit elements and it removes pulse noise such as ignition noise. A multiplex decoder block 28 includes about 390 circuit elements and it divides a stereo composite signal into right and left channel signals so as to output a stereo signal. An AM tuner block 29 includes about 350 circuit elements and it converts a received AM signal to an intermediate frequency signal (of 450 KHz) and detects the converted signal so that an audio output is obtained.

When the multiplex decoder block 28 and the FM-IF block 26 are to be incorporated in the semiconductor chip shown in FIG. 2, the multiplex decoder block 28 including about 390 circuit elements is divided into four portions each including less than 100 circuit elements and each of those four portions is formed in the corresponding one of the mats A, B, C, D. As described previously, the mats A to D are interconnected by means of the conductors 7a and 7b as shown in FIG. 3A. Similarly, the FM-IF block 26 including about 430 circuit elements is divided into five portions each including less than 100 circuit elements and each of those five portions is formed in the corresponding one of the mats E, F, G, H, I. The remaining mat J can be used for an optional circuit requested by the user and, for example, it can be used for a circuit for improving characteristics of an arbitrary circuit block.

Capacitors 13 included in the FM-IF block 26 are integrated in the mat E. Referring to FIG. 2, 11 capacitors are schematically shown by the broken lines in the mat E. Ground lines 3a and 3b are provided on both sides of the mat E so as to absorb leakage current generated from regions near those capacitors 13. A plurality of ground lines 3c having a comb teeth form for enhancing efficiency of absorption of the leakage current extend from the ground lines 3a.

Figure 5A:
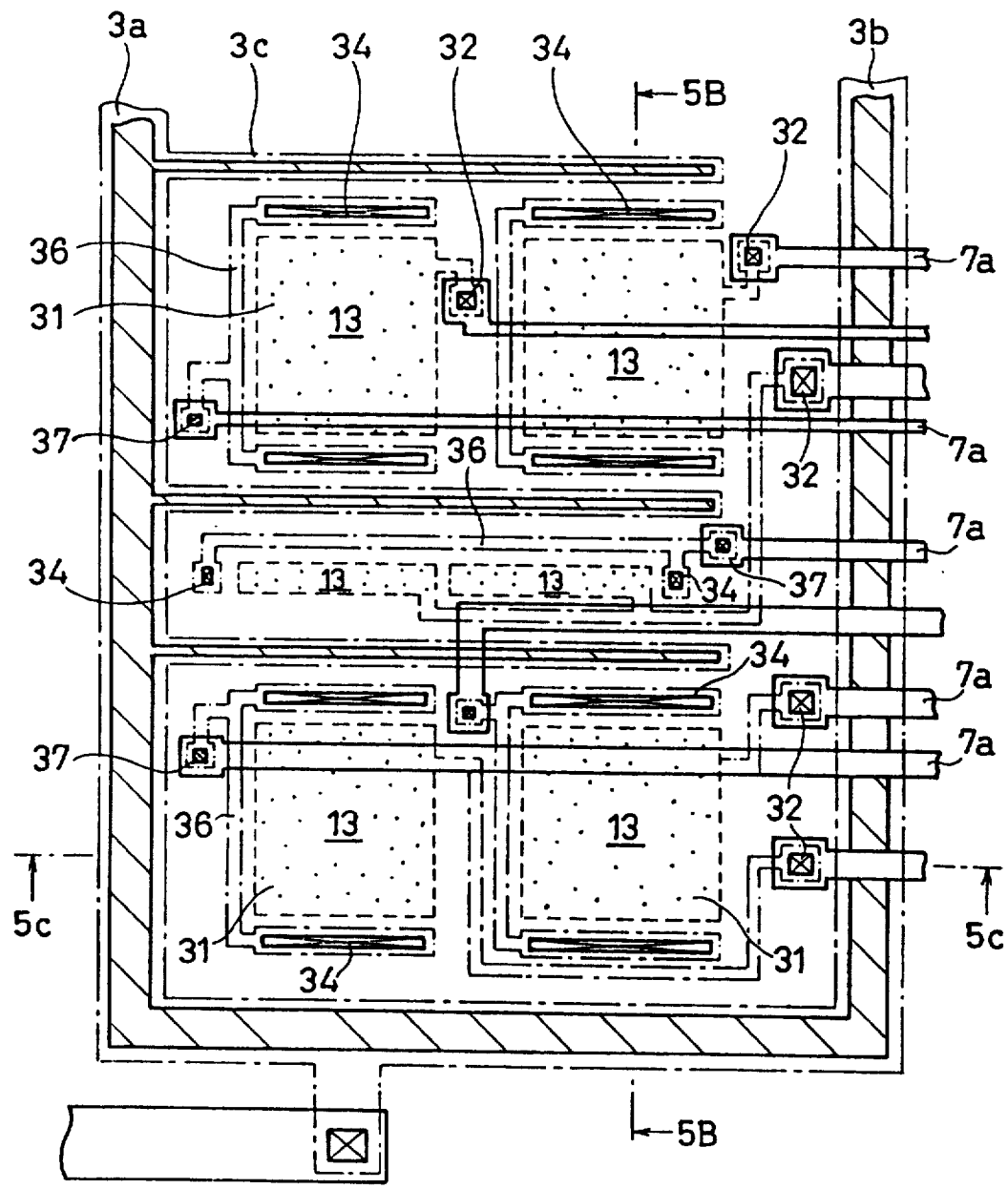
FIG. 5A is an enlarged detailed view of a part of FIG. 2.

Referring to FIG. 5A, a part of the mat E in FIG. 2 is shown in an enlarged manner. A plurality of metal-oxide semiconductor (MOS) capacitors 13 are formed between the ground lines 3a and 3b shown by the chain lines. The ground lines 3a, eb and 3c shown by the chain lines are in ohmic contact with P+ separation regions under those lines in hatched regions. Smudged regions of the capacitors 13 represent upper capacitor electrodes 31. The upper capacitor electrodes 31 are formed in the first conductor layer and they are connected to the conductors 7a in the second layer represented by the solid lines through contact regions 32 shown by the marks x. The conductors 7a in the second layer cross over the ground lines 3b and extend rightward so as to be introduced into any of the mats F-I.

Lower capacitor electrodes (shown in FIGS. 5B and 5C) opposed to the upper capacitor electrodes 31 are connected to lower capacitor electrode connectors 36 through contact regions 34 and the connectors 36 are connected to the conductors 7a in the second layer through contact regions 37.

Figure 5B:
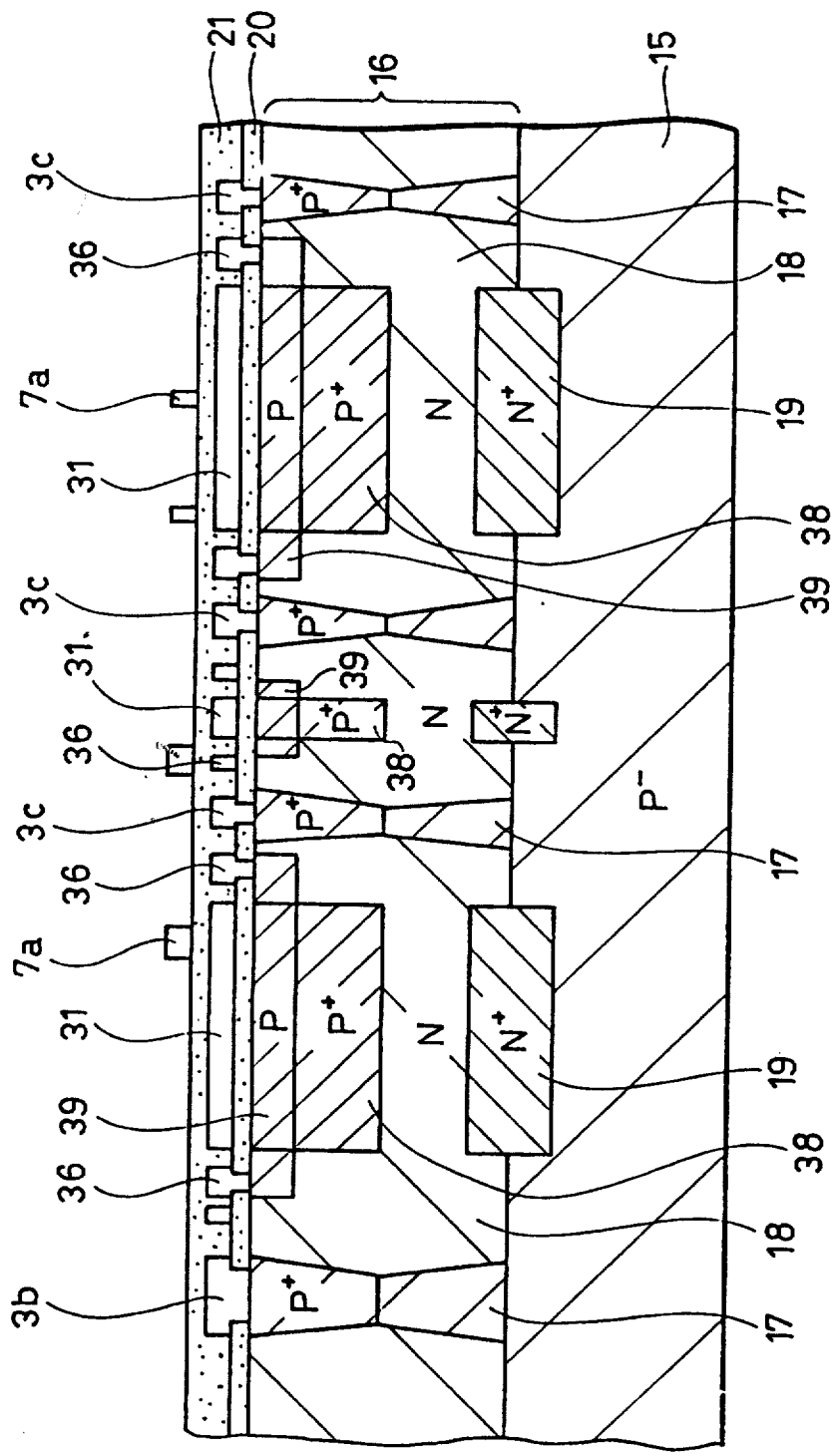
FIG. 5B is a sectional view taken along the line 5B—5B in FIG. 5A.
Figure 5C:
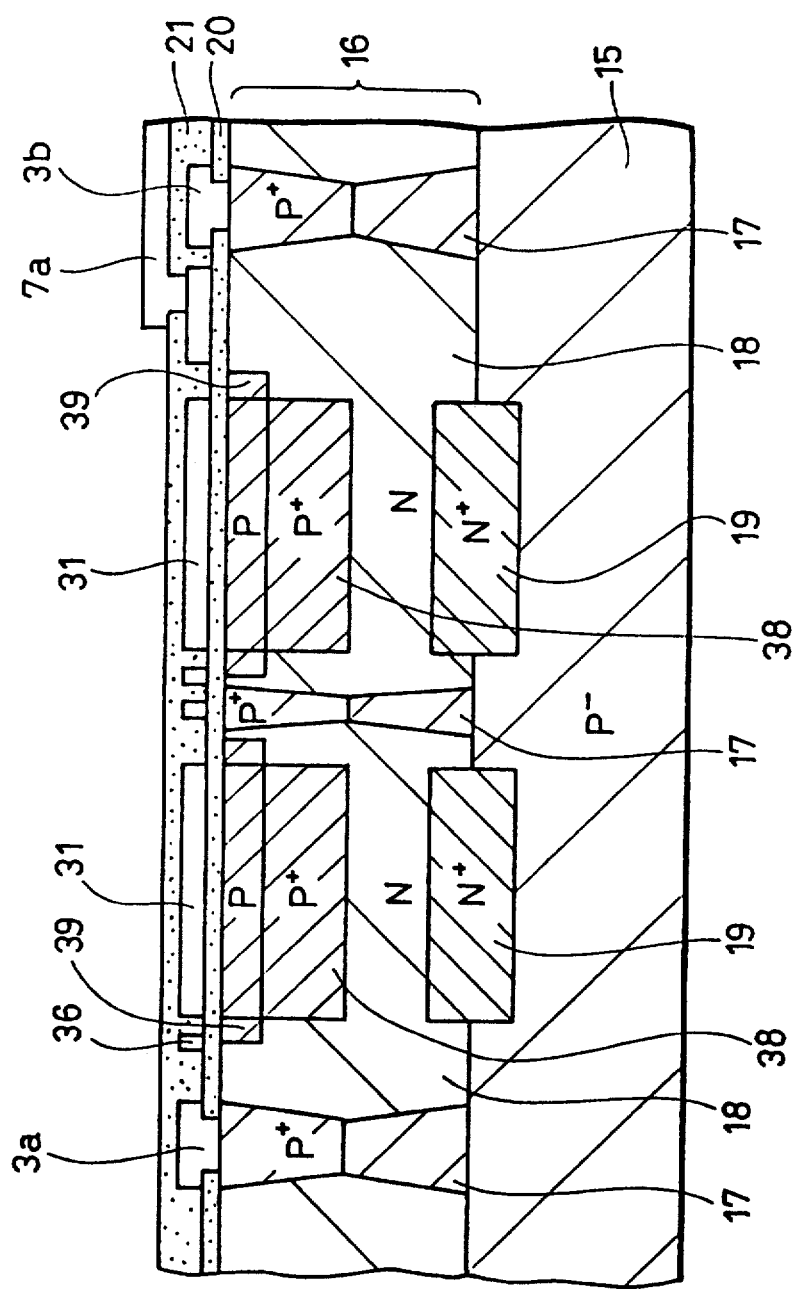
FIG. 5C is a sectional view taken along the line 5C—5C in FIG. 5A.

FIGS. 5B and 5C show schematic sectional views taken along the lines 5B—5B and 5C—5C in FIG. 5A, respectively. Referring to FIGS. 5B and 5C, P− semiconductor substrate 15, an epitaxial N layer 16, P+ separation regions 17, N islands 18, burried N+ layers 19, a silicon oxide film 20 and an insulating film 21 of such as polyimide resin are formed in the same manner as in FIG. 3B. However, P+ diffusion regions 38 are formed on respective surfaces of N islands 18 and P diffusion regions 39 overlapping with main portions of the P+ regions 38 are further formed. Thus, the P regions 38 and 39 constitute the lower capacitor electrodes opposed to the upper capacitor electrodes 31 and they are connected to the respective connectors 36.

In vicinities of the MOS capacitor 13 thus formed, leakage currents from junction capacitors formed by reverse bias of the PN junctions between the separation regions 17 and the islands 18, between the substrate 15 and the islands 18 and between the substrate 15 and the burried layers 19 can be absorbed reliably by the ground lines 3a, 3b, 3c through the separation regions. Consequently, the leakage current from the regions near the capacitors 13 never exert any adverse influence on the circuit elements of the adjacent mats D and F.

Figure 6:
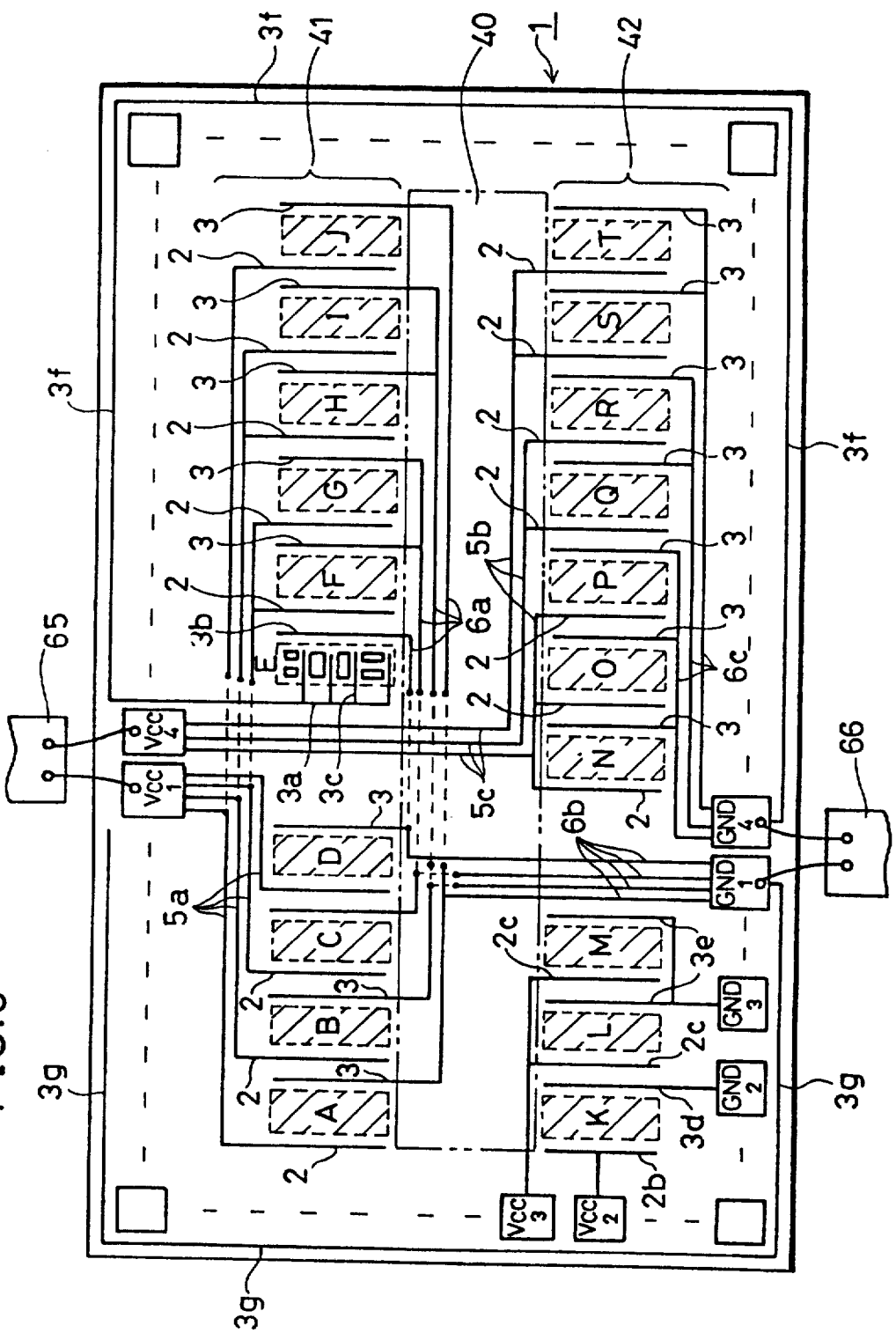
FIG. 6 is a schematic top view of a semiconductor IC according to another embodiment of the present invention.

Referring to FIG. 6, a surface pattern of a semiconductor IC according to another embodiment of the present invention is schematically shown. The semiconductor IC in FIG. 6 is similar to that in FIG. 2, except that the semiconductor chip 1 is divided into equal regions, i.e., first and second regions 41 and 42 by a division region 40 shown by the double-dot chain lines. Mats A to J are formed in the first region 41 and mats K to T are formed in the second region 42. All circuit blocks 25 to 29 of the AM-FM stereo tuner shown in FIG. 4 are integrated in this semiconductor chip 1.

The FM front end block 25 including about 250 circuit elements is formed in the mats K, L, M. The FM-IF block 26 including about 430 circuit elements is formed in the mats E, F, G, H, I. The noise canceller block 27 including about 270 circuit elements is formed in the mats N, O, P. The multiplex decoder block 28 including about 390 circuit elements is formed in the mats Q, R, S, T. The AM tuner block 29 including about 350 circuit elements is formed in the mats A, B, C, D. The conductors 7a and 7b which interconnect the mats are not shown in FIG. 6 for the purpose of clarifying the illustration.

Figure 7C:
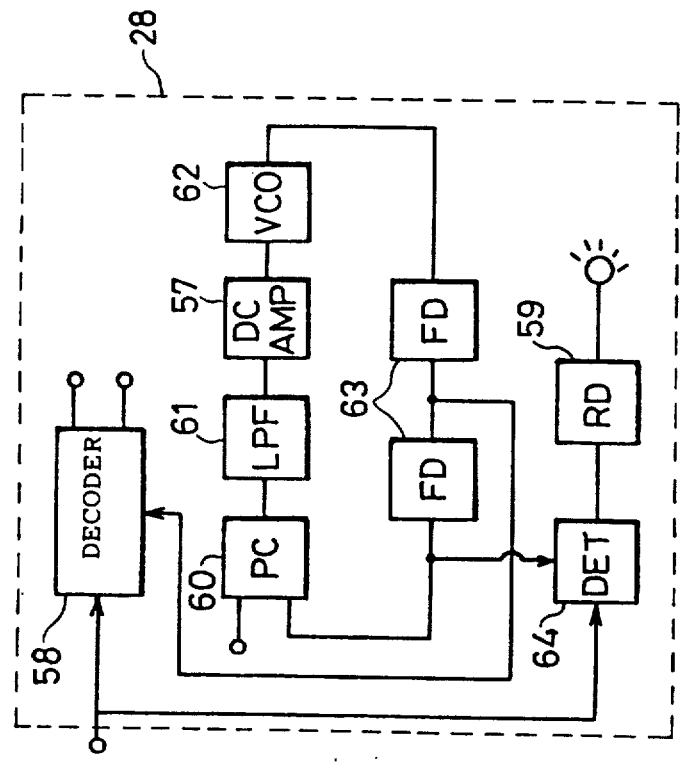
FIG. 7C is a sub block diagram showing details of a multiplex decoder block.
Figure 7A:
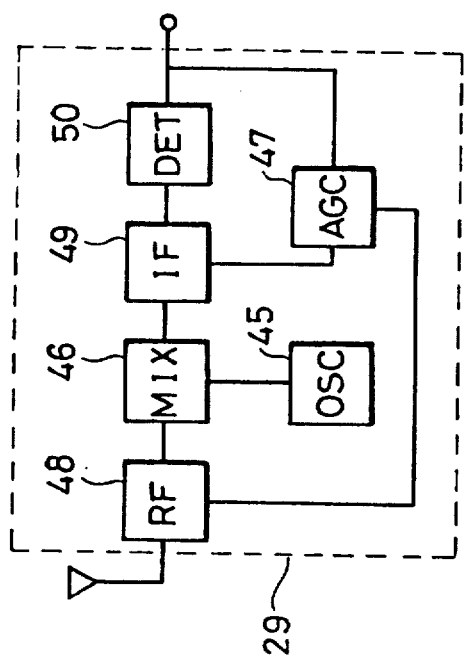
FIG. 7A is a sub block diagram showing details of an AM tuner block.
Figure 7B:
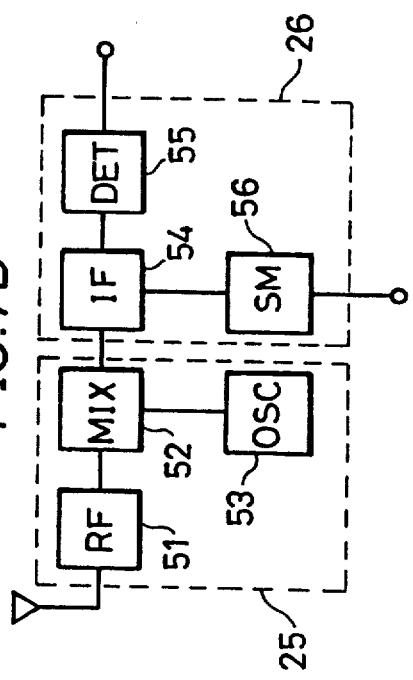
FIG. 7B is a sub block diagram showing details of an FM front end block and an FM-IF block.

Referring to FIGS. 7A, 7B and 7C, each of the AM block 29, the FM front end block 25, the FM-IF block 26 and the multiplex decoder block 28 is represented by a plurality of circuit sub blocks.

An oscillation circuit 45 in the AM tuner block 29 in FIG. 7A is formed in the mat A. A mixing circuit 46 is formed in the mat B. An automatic gain control circuit 47, a high frequency amplifying circuit 48 and an intermediate frequency amplifying circuit 49 are formed in the mat C. A detecting circuit 50 is formed in the mat D. A power supply line 2 extending along each of the mats A to D is connected to the corresponding one of the power supply lines of the bundle 5a extending along the upper side of the semiconductor chip 1 and connected to the first power supply pad Vcc1. A ground line 3 extending along each of the mats A to is connected to the corresponding one of the ground lines of the bundle 6a extending along the upper side of the division region 40. Each ground line 6a on the division region 40 extends from the first ground pad GND1 through the mats M and N and it is connected to the corresponding one of the ground lines of the bundle 6b extending toward the division region 40.

As shown in FIG. 7B, the FM front end block 25 includes a high frequency amplifying circuit 51, a mixing circuit 52 and an oscillating circuit 53 and it processes a signal of a very low level such as several μV. Accordingly, the FM front end block 25 is liable to be adversely affected by other circuit blocks, particularly by the FM-IF block 26 and therefore the FM front end block 25 and the FM-IF block 26 are conventionally formed on different semiconductor chips. On the other hand, the oscillating circuit 53 in the FM front end block 25 might cause unnecessary radiation to exert adverse effect on other circuit blocks. Therefore, the mats K to M where the FM front end block 25 is formed are sufficiently spaced in a diagonal direction of the semiconductor chip 1 from the mats E to I where the FM-IF block 26 is formed.

The oscillating circuit 53 in the FM front end block 25 is formed in the mat K in the left lower corner of the semiconductor chip 1 in order to avoid mutual interference with other circuit blocks. Further, the power supply line 2b and the ground line 3a provided for the mat K are connected to a second power supply pad Vcc2 different from the first power supply pad Vcc1 and to a second ground pad GND2 different from the first ground pad GND1, respectively, in order to avoid mutual interference with other mats. The power supply line 2c and the ground line 3e extending along each of the mats L and M are connected to a third power supply pad Vcc3 and to a third ground pad GND3, respectively.

The FM-IF block 26 includes an intermediate frequency amplifying circuit 54, a detecting circuit 55 and an S meter 56. The detecting circuit 55 is formed in the mat I and the S meter 56 is formed in the mat H. A limiter circuit, a muting circuit and the like included in the intermediate frequency amplifying circuit 54 are formed in the mats E, F, G. Capacitors included in the limiter circuit for removing an AM signal component contained in an FM signal are collected and formed in the mat E in the same manner as in the semiconductor device in FIG. 2. However, the ground line 3a extending along the left side of the mat E is connected to a ground line 3f extending along peripheral regions of the semiconductor chip 1 in the counterclockwise direction from a fourth pad GND4 adjacent to the first ground pad GND1.

Since the ground line 3f is in ohmic contact with the underlying P+ separation region along the longitudinal direction thereof, it not only receives the leakage current of the mat E absorbed by the grounds line 3a and 3c but also absorbs the leakage current in the peripheral regions of the semiconductor chip 1. Similarly, a ground line 3g extending along peripheral regions of the semiconductor chip 1 in the clockwise direction from the first ground pad GND1 absorbs leakage current in the peripheral regions of the semiconductor chip 1.

The limiter circuit included in the intermediate frequency amplifying circuit 54 in the mats E to G has a very high gain of 80 dB to 100 dB. The detecting circuit 55 in the mat I and the S meter 56 in the mat H have high signal levels. Consequently, an undesirable feedback signal generated from the detecting circuit 55 and the S meter to the intermediate frequency amplifying circuit 54 might cause oscillation. Such oscillation would affect adversely the characteristics of the detecting circuit 55 and the S meter 56. Therefore, in order to prevent such adverse effect, two power supply lines 2 extending along the mats F and G including the intermediate frequency amplifying circuit 54 are connected to one of the power supply lines of the bundle 5a extending along the upper side of the semiconductor chip 1, while two power supply lines 2 extending along the mat I including the S meter 56 and along the mat H including the detecting circuit 50 are connected to another line of the bundle 5a. In addition, a power supply line 2 extending along the mat J where an optional circuit desired by the user is formed is connected to a further line of the bundle 5a.

Similarly, two ground lines 3 along the mats F and G are connected to one of the ground lines of the bundle 6a on the division region 40 and the two ground lines 3 along the mats H and I are connected to another line of the bundle 6a. The ground line 3 along the mat J is connected to a further line of the bundle 6a.

A DC amplifying circuit 57, a decoder circuit 58 and a ramp driver circuit 59 included in the multiplex decoder block 28 in FIG. 7C are formed in the mats Q and R. The remaining phase comparing circuit 60, low-pass filter 61, voltage control oscillator 62, frequency-dividing circuit 63 and detecting circuit 64 are formed in the mats S and T. The two power supply lines extending along the mats Q and R are connected to one of the power supply lines of the bundle 5b extending along the lower side of the division region 40, while the two power supply lines extending along the mats S and T are connected to another line of the bundle 5b. The three power supply lines 2 extending along the mats N, O and P including the noise canceller block are connected to a further line of the bundle 5b. Each line of the bundle 5b is connected to the corresponding one of the power lines 5c extending from a fourth power line pad Vcc4 adjacent to the first power supply pad Vcc1 to the division region 40 through a region between the mats D and E.

Similarly, the two ground lines 3 extending along the mats Q and R are connected to one of the ground lines of the bundle 6c·extending along the lower side of the semiconductor chip 1 from the fourth ground line GND4 and the two ground lines 3 extending along the mats S and T are connected to another line of the bundle 6c. The three ground lines extending along the mats N, O, P are connected to still another line of the bundle 6c.

The separate fourth power supply pad Vcc4·adjacent to the first power supply pad Vcc1 and the separate fourth ground pad GND4 adjacent to the first ground pad GND1 are provided to reduce mutual interference between the circuit blocks. Each of the first and fourth power supply pads Vcc1 and Vcc4 is connected to a power supply lead 65 through a fine metallic wire. Consequently, even if a pulse noise occurs in either of the first and fourth power supply pads Vcc1 and Vcc4, the pulse noise is attenuated by impedance of the two fine metallic wires and accordingly influence on the other power supply pad can be reduced. Similarly, the first and fourth ground pads GND1 and GND4 are connected to a ground lead 66 through respective fine metallic wires.

As described above, a sufficient space (where the bundle 5c of power supply lines extends) is provided between the mats D and E and a sufficient space (where the bundle 6b of ground lines extends) is provided between the mats M and N. Accordingly, the FM front end block 25 included in the mats K to M is sufficiently spaced from other circuit blocks, particularly, from the FM-IF block 26 included in the mats E to I, whereby mutual interference between the circuit blocks can be prevented. Further, the bundle 5c of power supply lines serves to shield from the above described unnecessary radiation. Since at least one line of each of the bundles 6a and 6b of ground lines is in ohmic contact with the underlying P+ separation region, it absorbs leakage current, where mutual interference due to leakage current can be prevented.

Referring to FIG. 8, a positional relation of circuit blocks of an AM/FM tuner formed on the semiconductor chip 1 is shown. The FM front end block 25 and the FM-IF block 26 where it is particularly necessary to prevent mutual interference are spaced sufficiently from each other in a diagonal direction of the semiconductor chip 1. The division region 40 may include an additional division region 40a extending between the AM tuner block 29 and the FM-IF block 26 and it may further include an additional division region 40b extending between the FM front end block 25 and the noise canceller block 27. Thus, the noise canceller block 27 and the multiplex decoder block 28 are also spaced sufficiently from the FM front end block 25 and the FM-IF block 26. In addition, the AM tuner block 29 is also spaced sufficiently from other circuit blocks 25 to 28.

Referring to FIG. 9, a plurality of elongate dummy islands for enhancing the effect of preventing mutual interference of the circuit blocks are shown. The plurality of elongate N dummy islands 70 represented as being smudged are provided in spaces in the division regions 40, 40a, 40b. Those N dummy islands are surrounded by P+ separation regions at the ground potential and they are electrically independent of other N regions. Since barriers are formed by PN junctions formed around the dummy islands, resistance to leakage current is increased, making it possible to reduce mutual interferences of the mat groups A to D, E to J, K to M and N to T. The mats K, L, M where the FM front end block 25 is formed may be surrounded by a dummy island 71. In addition, a dummy island portion 72 may be added so that only the mat K including the oscillation circuit 53 may be surrounded entirely by the dummy islands.

Since the AM tuner block 29 does not operate simultaneously with the FM circuit section, it is not necessary to take account of mutual interference with the FM circuit section. Accordingly, the AM tuner block 29 included in the mats A to D and the FM-IF block 26 included in the mats E to I utilize in common the first power supply pad Vcc1, the first ground pad GND1 and the bundle 6b of ground lines. In consequence, the areas occupied by the bonding pads and conductors can be reduced.

The portions shown by the broken lines in the bundle 5a of power supply lines and the bundle 6a of ground lines in FIG. 6 represent conductors in the second layer as in FIG. 2.

Figure 10:
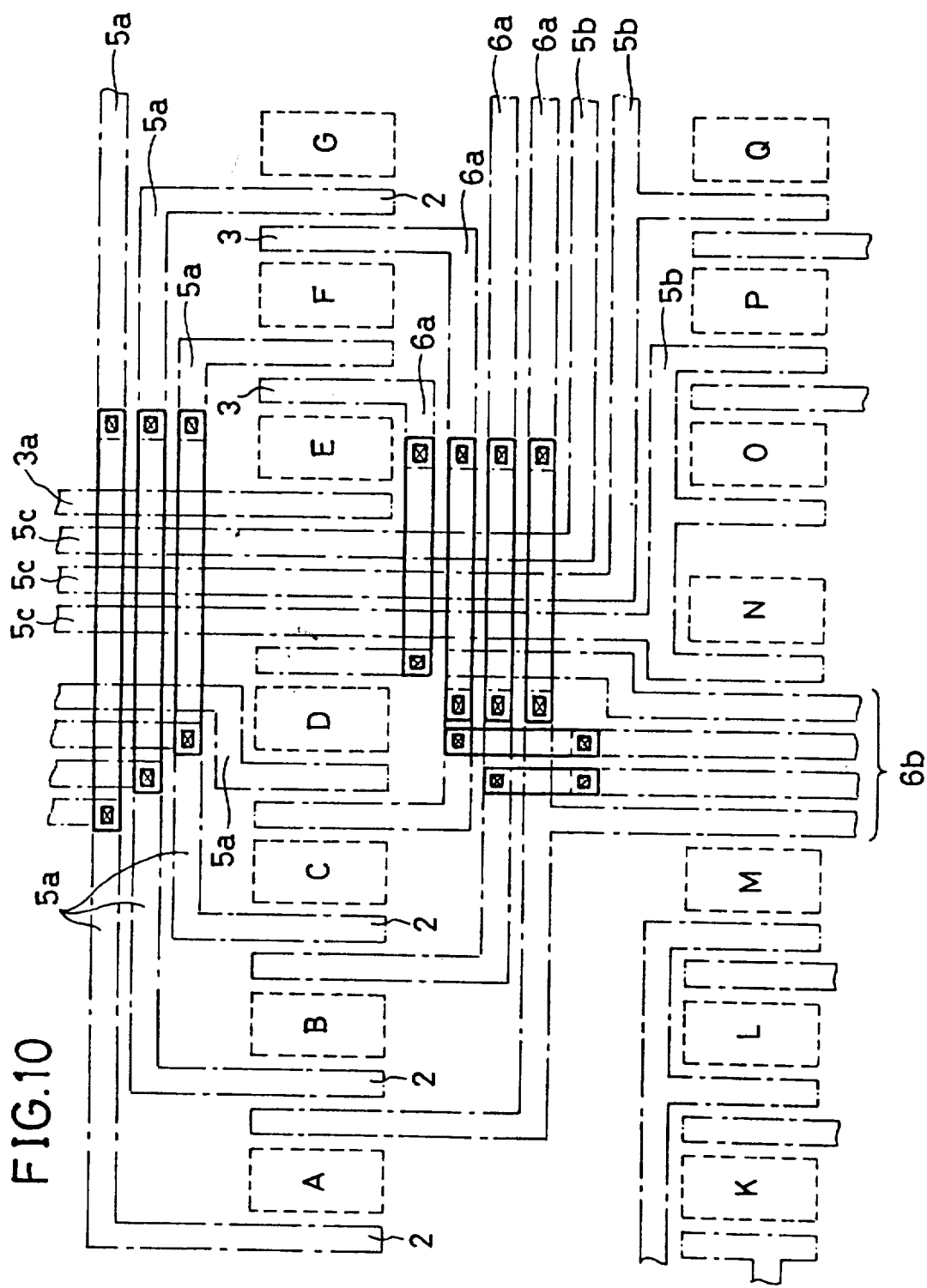
FIG. 10 is a top view showing schematically a 2-level crossing of power supply lines and ground lines in the semiconductor IC of FIG. 6.

Referring to FIG. 10, the 2-level crossing of the power supply lines and the ground lines in FIG. 6 is schematically illustrated. The conductors represented by the single-dot chain lines exist in the first layer and the conductors represented by the solid lines exist in the second layer. The conductors in the first and second layers are connected through contact regions shown by the marks x. In consequence, the bundle 5a of power supply lines and the bundle 6a of ground lines cross over the bundle 5c of power supply lines.

If the AM tuner block 29 is not required, the multiplex decoder block 28 can be shifted from the mats Q to T to the mats A to D. In that case, it is not needed to entirely change the arrangements of the circuit elements and conductors in the multiplex decoder block 28 and only the conductors between the circuit blocks need to be rearranged. Similarly, if the circuits in the mats I and J are shifted to the vacant mats Q and R, the four mats I, J, S and T at the right end are not required.

If an improvement is made only in the mat F of the FM-IF block 26 for example, it is only necessary to redesign the mat F and no change is required for the other mats.

In addition, if a user desires an additional circuit block in addition to the optional mat J, only a necessary number of mats need to be added.

Thus, according to the present invention, since mats of the substantially same size are arranged in a line form or a matrix form on the semiconductor chip, it is easy to change, add and delete circuit blocks as required. Accordingly, circuit blocks to be used in an electronic circuit of a large scale can be individually designed and stocked. As a result the time required for design of a large-scale electronic circuit can be considerably reduced and a high reliability can be maintained.

In addition, if capacitors each having a relatively large area are formed in one mat, forms and arrangements of other circuit elements such as transistors, diodes and resistors do not need to be taken into account and thus it becomes easy to design the capacitors. In consequence, it is not needed to take account of leakage current from the capacitors in the mats not including the capacitors and it becomes easy to design circuits in those mats.

Referring to FIG. 11A, a semiconductor IC according to a further embodiment of the present invention is schematically shown. In this figure, interconnections between the mats are not shown for the purpose of simplification of the illustration. An electronic circuit often includes first and second circuit sections which do not operate simultaneously, as in the above described case of the AM and FM sections in the AM/FM stereo tuner. It is often necessary to prevent mutual interference between circuit blocks in the same section. The embodiment in FIG. 11A is preferable for such cases. The semiconductor IC of FIG. 11A is similar to that of FIG. 2, except that alternate mats A, C, E and G include a circuit block in a first circuit section and the other alternate mats B, D, F and H include a circuit block in a second circuit section. More specifically, one of the mats of the second circuit section is located between the adjacent mats of the first circuit section and one of the mats of the first circuit section is located between the adjacent mats of the second circuit section.

When the mats A, C, E, G including the first circuit section are in operation, the mats B, D, F of the second circuit section between the corresponding ones of the mats A, C, E, G are not operated and they are in a high impedance state. Thus, mutual interference between the respective mats A, C, E, G of the first circuit section is suppressed. On the other hand, when the mats B, D, F, H including the second circuit sections are in operation, the mats C, E, G of the first circuit section are not operated and in a high impedance state. Accordingly, mutual interference between the mats B, D, F, H of the second circuit section is suppressed.

The mats not in operation each function as a large capacitor of a PN junction type per se and serve to remove high frequency noise. For example, even if high frequency noise enters the P− semiconductor substrate 15 through the mat A, the mat B functions as a large PN junction type capacitor and the noise is absorbed through the power supply line 2 connected to the mat B. As a result, mutual interference between the mats A and C due to the high frequency noise can be prevented.

In addition, since the power supply line 2 for the mat A and the power supply line 2 for the mat C for example are connected in parallel with each other to the first power supply pad Vcc1, any change in the potential in the mat A is not transmitted directly to the mat C.

Figure 11B:
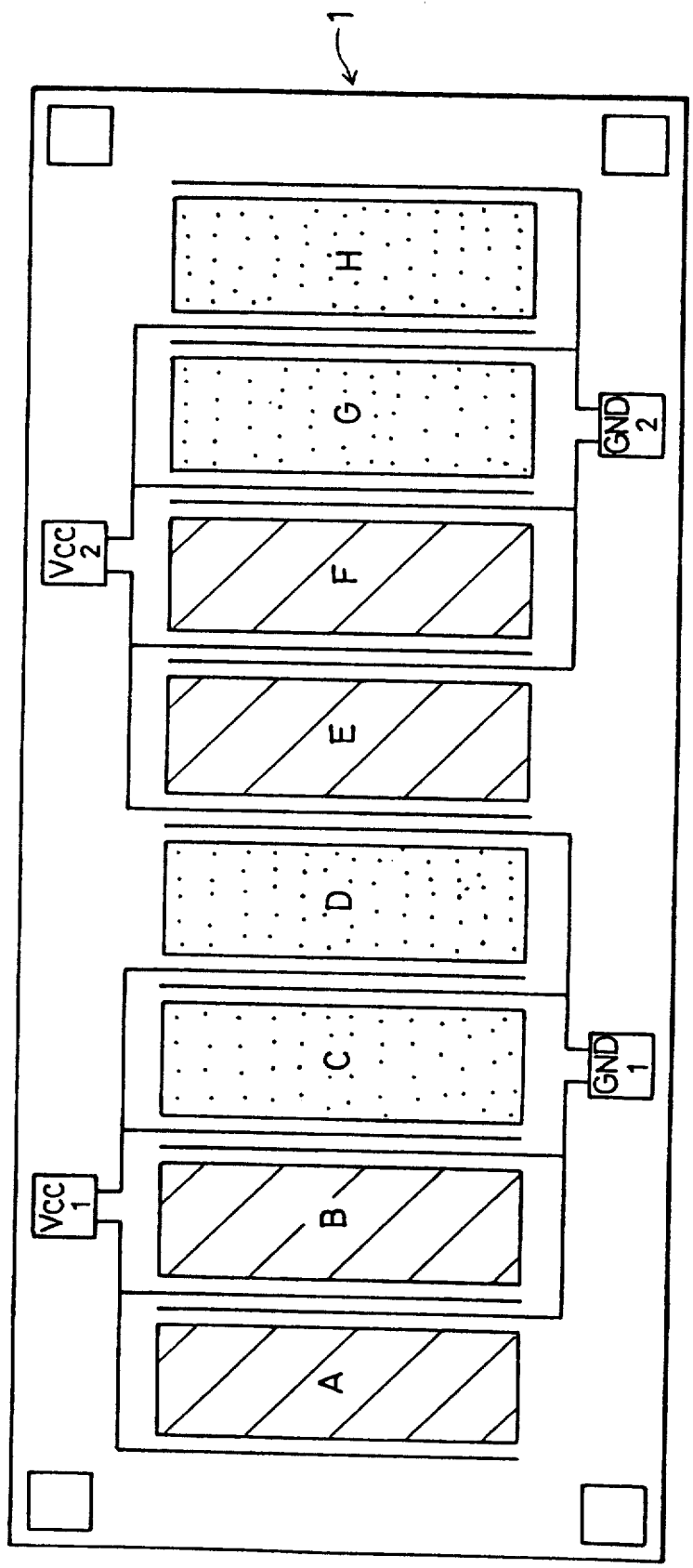
FIG. 11B is a schematic top view of a semiconductor IC according to a still further embodiment of the present invention.

Referring to FIG. 11B, a semiconductor IC according to a still further embodiment of the invention is schematically shown. Although the semiconductor IC of FIG. 11B is similar to that of FIG. 11A, there are differences in that a circuit block in the first circuit section is formed in the mats A, B, E, F and that a circuit block in the second circuit section is formed in the mats C, D, G, H. Thus, two mats of the first circuit section and two mats of the second circuit section are arranged in turn. In the semiconductor IC of FIG. 11B, the group of the mats A and B and that of the mats E and F of the first circuit section can be spaced sufficiently. Similarly, the group of the mats C and D and that of the mats G and H of the second circuit section can be spaced sufficiently.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit manufacture, comprising:
   a semiconductor layer formed on a semiconductor chip;
   a plurality of mats each defining a respective area of substantially the same size formed in said semiconductor layer, each of said respective areas constituting an entirety of a respective one of said mats, said areas each being capable of containing substantially the same number of a plurality of circuit elements;
   an electronic circuit formed in said semiconductor layer and having a plurality of circuit blocks each having a respective circuit configuration and function which differ from that of each other, at least one of said circuit blocks being substantially constituted by a respective group of said circuit elements that are contained within a plurality of said areas of a respective group of said mats, said respective group of circuit elements including a respective number of said circuit elements that is greater in number than said same number of plurality of circuit elements and which includes substantially all of said circuit elements contained in said area of one of said mats, said respective group of circuit elements cooperating with each other to provide one of said respective circuit configurations and functions;
   interconnection means for interconnecting the circuit elements which are contained within mats that comprise said respective plurality of mats; and
   means for powering and grounding said electronic circuit, said powering and grounding means including power supply and ground lines.

2. A circuit manufacture in accordance with claim 1, wherein
   said semiconductor chip is divided into first and second regions spaced from each other by a division region and said plurality of mats are formed in said first and second regions.

3. A circuit manufacture in accordance with claim 2, wherein
   said electronic circuit includes first and second circuit blocks no operating simultaneously and a third circuit block 28 operating at all times, the mats including said first and second circuit blocks utilize in common a first power supply pad and a first ground pad on said semiconductor chip, and the mats including said third circuit block utilize a second power supply pad (Vcc4) and a second ground pad (GND4).

4. A circuit manufacture in accordance with claim 3, wherein said electronic circuit is an AM/FM stereo tuner, said first and second circuit blocks are an AM tuner block and an FM-IF block, and said third circuit block is a multiplex decoder block.

5. A circuit manufacture integrated circuit in accordance with claim 2, wherein spaces are provided in which a bundle of conductors is disposed between an adjacent two mats in groups of the mats in any one of said first region and said second region.

6. A circuit manufacture in accordance with claim 5, wherein
   one or more elongate dummy islands are provided under each said space where said bundle of conductors are disposed.

7. A circuit manufacture in accordance with claim 1, wherein
   at least one mat of said plurality of mats is a capacitor mat including only capacitors as circuit elements.

8. A circuit manufacture in accordance with claim 7, wherein
   ground lines are provided on at least one side of said capacitor mat and said ground lines along the total lengths thereof are in ohmic contact with separation regions lying thereunder.

9. A circuit manufacture in accordance with claim 8, wherein
   ground lines are further provided to extend in a comb-teeth form from at least one of the ground lines on at least one side of said capacitor mat and said ground lines in the comb-teeth form are in ohmic contact with underlying separation regions.

10. A circuit manufacture in accordance with claim 7, wherein
    each of said capacitors is formed in an island surrounded by separation regions.

11. A circuit manufacture in accordance with claim 1, wherein said mats are divided by partition regions, and said power supply lines and ground lines being formed on said partition regions.

12. A circuit manufacture in accordance with claim 11 wherein
    the power supply lines on said partition regions extend from a bundle of power supply lines in a comb-teeth form and the ground lines on said partition regions also extend from a bundle of ground lines in a comb-teeth form, the comb-teeth form of said power supply lines and the comb-teeth form of said ground lines being opposite to each other.

13. A circuit manufacture in accordance with claim 11, wherein
    the two circuit blocks where it is necessary to prevent mutual interference are formed in the two groups of mats spaced from each other in a diagonal direction of said semiconductor chip.

14. A circuit manufacture in accordance with claim 13, wherein
    said electronic circuit is an AM/FM stereo tuner and the two circuit blocks where it is necessary to prevent mutual interference are an FM front end block and an FM-IF block.

15. A circuit manufacture in accordance with claim 14, wherein
an oscillating circuit included in said FM front end block is formed in the mat at a corner of said semiconductor chip.

16. A circuit manufacture in accordance with claim 14, wherein
the mat including the oscillating circuit included in said FM front end block is entirely surrounded by dummy islands.

17. A circuit manufacture in accordance with claim 13, wherein
the mat group including said FM front end block is surrounded by dummy islands.

18. A circuit manufacture in accordance with claim 1, wherein a respective group of an integral number of mats constitutes each said circuit block, respectively, and said respective group does not include circuit elements from any other circuit block.

19. A circuit manufacture in accordance with claim 1, wherein each of said mats of said respective group of mats have a relative arrangement of said circuit elements therein, said relative arrangements differing from each other.

20. A circuit manufacture in accordance with claim 1, wherein said electronic circuit includes first and second circuit sections which are free from operating simultaneously, each of said circuit sections including at least one circuit block having a respective plurality of said mats, at least one of said mats of at least one of said circuit blocks of said first circuit section being arranged between two of said mats of one of said circuit blocks of said second circuit section so that said one mat has an impedance which prevents mutual interference from arising between said two mats when said second circuit section is operating.

21. A circuit manufacture in accordance with claim 20, wherein
the mats of said first circuit section and the mats of said second circuit section are formed alternately.

22. A circuit manufacture in accordance with claim 1, wherein each of said circuit blocks include respective circuit elements, said respective circuit elements of each of said circuit blocks being on respective mats, each of said respective mats being free from accommodating therein any of said respective circuit elements which are of any other of said circuit blocks.

23. A circuit manufacture in accordance with claim 1, wherein
said semiconductor chip has a substantially rectangular form,
an FM front end circuit block is formed in a respective plurality of said mats near a first corner of said semiconductor chip, spaced from an FM-IF circuit block at a second corner in a substantially diagonal direction of said semiconductor chip, and
a multiplex decoder circuit block and an AM tuner circuit block are formed in respective pluralities of said mats near third and fourth corners, respectively spaced from each other in the other substantially diagonal direction on said semiconductor chip.

24. A circuit manufacture as in claim 1, wherein a plurality of the mats of the respective group of mats are spaced from each other and arranged in line within a row, further comprising a further mat arranged also within the row and in line with the mats within the row.

25. A circuit manufacture comprising:
a semiconductor chip
a region where only a plurality of capacitors are formed in said semiconductor chip,
ground lines provided at least along one side of said region, and
separation regions under said ground lines, being in ohmic contact with said ground lines along a total length thereof.

26. A circuit manufacture in accordance with claim 25, wherein
ground lines are further provided to extend in a comb-teeth form into said region from one of the ground lines along at least one side of said region and said ground lines in the comb-teeth form are also in ohmic contact with separation regions thereunder.

27. A circuit manufacture, comprising:
a semiconductor layer formed on a semiconductor chip;
an electronic circuit which includes a plurality of circuit blocks each having a respective circuit configuration and function which differs from that of each other and being selected from a group consisting of an FM front end circuit block, an FM-IF circuit block, a noise canceler circuit block, a multiplex decoder circuit block, and an AM tuner circuit block, each of said circuit blocks being in said semiconductor layer and each having a respective group of circuit elements contained in a respective groups of mats, said mats each being of substantially the same size for being capable of containing substantially the same number of circuit elements, said mats being formed in said semiconductor layer and being spaced from each other, said respective group of circuit elements including a respective number of said circuit elements that is greater in number than said same number of plurality of circuit elements and which includes substantially all of said circuit elements contained in at least one of said mats, said respective group of circuit elements cooperating with each other to provide one of said respective circuit configurations and functions;
interconnection means for interconnecting the circuit elements which are contained in mats which comprise said respective plurality of mats; and
means for powering and grounding said electronic circuit, said powering and grounding means including power supply and ground lines which extend between a plurality of said circuit blocks.

28. A circuit manufacture as in claim 27, wherein said FM front end block receives and converts an FM broadcasting signal into an intermediate signal, said FM-IF circuit block amplifying the intermediate signal and detecting the amplified intermediate signal for producing an audible tone, said noise canceler circuit block removing pulse noises, said AM tuner block circuit converting a received AM signal into an intermediate frequency signal and detecting the converting intermediate frequency signal for producing an audio output.

29. A circuit manufacture as in claim 28, wherein said FM front end block includes a plurality of a high frequency amplifying circuit, a mixing circuit and an oscillation circuit, said FM-IF circuit block including a plurality of an intermediate frequency amplifying circuit, a detecting circuit, and an S meter, said multiplex decoder circuit block including a plurality of a DC amplifying circuit, a decoder circuit, a ramp driver circuit, a phase comparing circuit, a low-pass filter, a voltage control oscillator, a frequency-dividing circuit, and a detecting circuit.

30. A circuit manufacture, comprising:
   a semiconductor layer formed on a semiconductor chip;
   a plurality of mats each defining a respective area of substantially the same size formed in said semiconductor layer, each of said respective areas constituting an entirety of a respective one of said mats, said areas each being capable of containing substantially the same number of a plurality of circuit elements;
   an electronic circuit formed in said semiconductor layer and having a plurality of circuit blocks each having a respective configuration of circuit elements cooperating with each other for performing at least one function, at least one of said respective configurations being contained within said areas of a respective group of said mats, the one respective configuration being substantially comprised of a respective number of said circuit elements that is greater tin number than said same number of plurality of circuit elements and which includes all of said circuit elements contained in said area of one of said mats;
   interconnection means for interconnecting the circuit elements between said areas that comprise said respective group of said mats; and
   means for powering and grounding said electronic circuit, said powering and grounding means including power supply and ground lines which extend between a plurality of said circuit blocks.

31. A method of making a pattern layout on a chip, comprising the steps of:
   (a) determining a number of a plurality of circuit elements necessary for constituting a circuit block that is capable of performing at least one function;
   (b) determining a number of a plurality of mats in a semiconductor layer of the chip that are necessary to accommodate the plurality of circuit elements based on dividing the determined number of the plurality of circuit elements by a number of circuit elements capable of being contained within any of the mats, each mat being capable of containing substantially the same number of circuit elements; and
   (c) making a pattern layout of the circuit elements in the plurality of mats in the semiconductor layer of the chip.

32. A method as in claim 31, further comprising the step of repeating steps (a), (b) and (c) for a plurality of circuit blocks each having a different pattern layout and function.

* * * * *